United States Patent
Scheller et al.

(10) Patent No.: US 6,383,864 B2
(45) Date of Patent: *May 7, 2002

(54) MEMORY CELL FOR DYNAMIC RANDOM ACCESS MEMORY (DRAM)

(75) Inventors: Gerd Scheller, Thalwil (CH); Martin Gall, South Burlington, VT (US); Reinhard J. Stengl, Stadtbergen (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/940,897

(22) Filed: Sep. 30, 1997

(51) Int. Cl.⁷ .......................................... H01L 21/8242
(52) U.S. Cl. ...................................... 438/243; 438/245
(58) Field of Search ................................ 438/243–247, 438/386–392; 257/301

(56) References Cited

U.S. PATENT DOCUMENTS

| | | | |
|---|---|---|---|
| 5,256,588 A | * | 10/1993 | Witek et al. |
| 5,302,541 A | * | 4/1994 | Akazawa |
| 5,316,962 A | * | 5/1994 | Matsuo et al. |
| 5,780,335 A | * | 7/1998 | Henkels et al. |
| 5,792,685 A | * | 8/1998 | Hammerl et al. |

\* cited by examiner

Primary Examiner—Jey Tsai

(57) ABSTRACT

A memory cell, which includes a transistor and a capacitor, for use in a DRAM uses a silicon-filled vertical trench as the capacitor and a vertical transistor superposed over the vertical trench in a silicon chip. An epitaxial layer is formed at the top of the fill in the trench to impart seed information to the primarily polysilicon silicon fill in the trench. A polysilicon layer is deposited over the top surface of the chip, is apertured over the top of the trench, and has its sidewalls oxidized. The opening is then refilled with epitaxial silicon in which there is created in operation an inversion layer that serves as the channel of the transistor, and the deposited polysilicon layer serves as the word line. Another silicon layer is deposited over the epitaxial layer to serve as the bit line. The source/drain regions of the transistor are formed at the merger of the deposited layer with the fill in the trench and the merger with the polysilicon layer that serves as the bit line.

12 Claims, 5 Drawing Sheets

MEMORY CELL FOR DYNAMIC RANDOM ACCESS MEMORY (DRAM)

FIELD OF THE INVENTION

This invention relates to memory cells for use in a dynamic random access memory (DRAM) and, more particularly, to a memory cell that uses a dielectrically-filled vertical trench as a storage node and a vertical transistor as a switch located over the trench.

BACKGROUND OF THE INVENTION

DRAMS have become among the most important of the integrated circuit devices and are the source of continuing research and development which, in particular, aims to increase their storage capacity and writing and reading speeds. This has necessitated the use of smaller and more closely spaced memory cells for use in the memory arrays. Of increasing significance are memory cells in which the storage node is provided by a polysilicon-filled trench in a silicon chip and the switching transistor is a vertical transistor located in the chip over the trench. It is known that a DRAM that uses a MOSFET as the switching transistor. The two output current terminals of the transistor alternate between source and drain roles as the storage node is charged and discharged. As such, each of these terminals can be described as a source/drain and a drain/source, as is appropriate for the particular role. For purposes of discussion, these terminals are simply referred to as a source/drain. The vertical transistor is located over the storage node in a manner which renders the surface area of the chip used by the cell to be essentially the same as that used by the vertical trench. Ideally, a cell using a vertical transistor can provide higher packing densities than a cell that uses a horizontal switching transistor that is positioned adjacent to the trench that provides the storage node. One type of a vertical transistor over a vertical trench cell is described in U.S. patent application Ser. No. 08/770,962, filed on Dec. 20, 1996, in which Norbert Arnold is the inventor and the assignee is the same as that of the present application.

SUMMARY OF THE INVENTION

A memory cell of the present invention has a unique structure fabricated by a novel process. In one embodiment, a semiconductor chip is first provided with a vertical trench to be used in forming the storage capacitor of the cell. After the trench is made, the dielectric of the capacitor is formed by coating its walls with a dielectric material. The storage node of the capacitor is provided by a doped polysilicon fill of the trench. The top portion of the trench is provided with essentially monocrystalline silicon, suitable for forming one source/drain of the vertical transistor. An additional silicon layer, intermediately placed between two dielectric layers, is subsequently deposited over the chip. The three layers are apertured in the region over the trench to expose the top of the fill. Typically, this layer is polysilicon. The walls of the additional polysilicon layer that were exposed in the aperturing operation are oxidized to form the gate dielectric of the transistor. The aperture is then filled with silicon that is appropriate to form the intermediate layer of the transistor in which there is to be created during operation the inversion layer that forms the channel between the source/drain regions of the transistor. Ultimately an additional silicon layer is formed that will form with this intermediate layer the second source/drain region of the transistor. A bit line connection is made to this last-mentioned layer, and a word line is provided by the apertured polysilicon layer.

Another embodiment of the present invention is directed to a memory cell that is for use in a memory array of rows and columns of memory cells within a monocrystalline bulk portion of a silicon chip and that is addressed by word lines and bit lines. The memory cell comprises a capacitor, a vertical transistor, a word line, and a bit line. The capacitor comprises a vertical trench filled with silicon and having a layer of dielectric along its wall that isolates the silicon fill from the bulk portion of the chip. The vertical transistor is superposed over the trench and has a first source/drain merged with the silicon at the top of the trench, an intermediate silicon layer that is merged with the silicon fill at the top of the trench to form the first source/drain region, and in which an inversion layer is to be created to form a conductive channel, a second source/drain region overlying the intermediate silicon layer, a gate dielectric layer surrounding the intermediate silicon layer, and a gate surrounding the gate dielectric layer and extending along the surface of the chip and dielectrically insulated therefrom and being coupled to a word line. The bit line is in electrical contact with the second source/drain and otherwise extends over the surface of the trench and is electrically insulated from the word line and from the chip.

In another embodiment, the invention is a novel process of fabricating the cell that includes imparting seed information to the polysilicon deposited in the trench. This seed information makes it possible to provide a semiconductor intermediate layer wherein the channel of the transistor can be created.

In another embodiment, the present invention is directed to a process for making a memory cell. The process comprises the steps of forming a trench in a semiconductor chip of one conductivity type; forming a dielectric layer over the walls of the trench; filling the trench with polysilicon of a conductivity type opposite that of the chip; growing an epitaxial silicon layer over the surface of the chip of sufficient thickness for forming over the top of the trench a layer of essentially monocrystalline silicon of a conductivity that is opposite that of the chip for serving as a first source/drain; forming a first dielectric layer over the surface of the chip; forming a polysilicon layer of the conductivity type opposite that of the chip over the surface of the first dielectric layer; forming a second dielectric layer over the surface of said polysilicon layer; etching an opening through the first and second dielectric layers and said polysilicon layer to bare the essentially monocrystalline silicon over the top of the trench; forming a silicon oxide layer selectively along the sidewall of the opening in the polysilicon layer; growing monocrystalline silicon of the one conductivity type in the opening for forming an intermediate layer in which there will be formed the channel of a vertical transistor in which the silicon oxide layer over the sidewall of said polysilicon layer of the opening serves as the gate dielectric; and depositing a conductive layer of the opposite conductivity type over the top surface of the chip that contacts the intermediate silicon layer for serving as a second source/drain and bit line of the cell.

The invention will be better understood from the following more detailed description taken in conjunction with the accompanying drawing.

DETAILED DESCRIPTION

Figure 1:
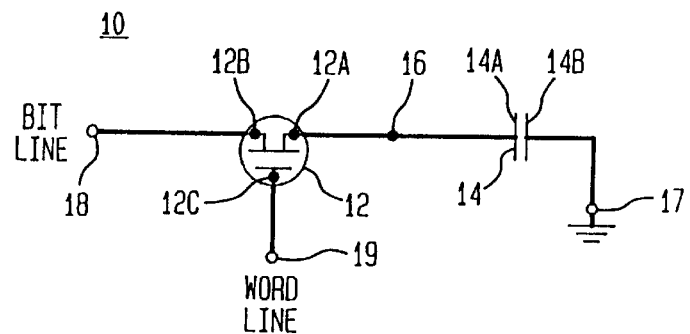
FIG. 1 is an electrical circuit schematic of a standard memory cell that includes a transistor and a capacitor of the kind used in DRAMS.

FIG. 1 shows an electrical circuit schematic of a memory cell 10. Such a cell is employed, for example, in a random access memory (RAM) integrated circuit (IC) or chip. Such a cell can also be used in a dynamic RAM (DRAM), a synchronous DRAM (SDRAM), or other memory chip. The cell includes a MOS transistor 12 in series with a capacitor 14. Transistor 12 has first and second output current electrodes 12A and 12B, respectively, and a gate electrode 12C. Gate electrode 12C of the switching transistor is connected to a word line of the DRAM array. Electrode 12A serves as the drain of the transistor when positive current flows therefrom through transistor 12 and into electrode 12B, which then serves the source. This occurs when logic information (data, signal bits, i.e., a "1" or a "0") is read into or refreshed into memory cell 10. Electrode 12B serves as the drain when information is read out of memory cell 12 as current flows from electrode 12B through transistor 12 to electrode 12A which serves as the source. However, as mentioned earlier, for simplicity, each will be described as a source/drain of transistor 12. Capacitor 14 has first (14A) and second (14B) plates. Plate 14B is typically coupled to a reference voltage, which is shown as ground 17 in the drawing. In some instances, it may be desirable to use some other reference voltage on plate 14B, such as Vpp/2. Transistor 12 is switched on to facilitate current flow from a bit line 18, which is connected to electrode 12A, to capacitor 14. It is switched off to isolate capacitor 14 from the bit line 18. A signal corresponding to a bit of information (logic information) is stored as charge on capacitor 14. When appropriate signals are applied to the word line 19 and to the bit line 18, data ("1" or a "0") is stored as charge on the capacitor 14 where it is held for a useful time. Because of leakage from storage node 16, it is generally necessary to refresh the stored data periodically.

Figure 2:
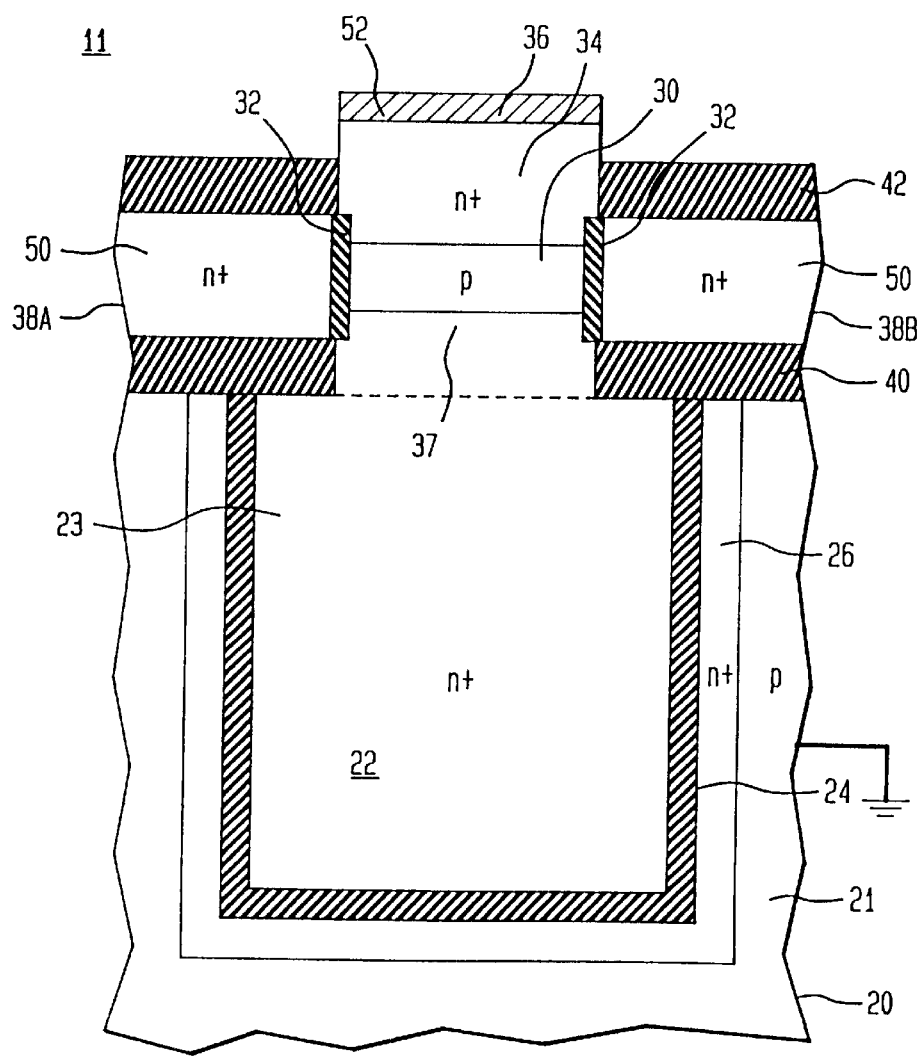
FIG. 2 is a cross section of a portion of a silicon chip including a memory cell that has the electrical schematic of the cell of FIG. 1 and comprises a vertical trench for a capacitor and a superposed vertical transistor, in accordance with the present invention.

FIG. 2 shows a structure of a memory cell 11 in accordance with the invention. A plurality of memory cells are interconnected to form an array or arrays. Such arrays are used to form memory integrated circuits such as DRAMs, synchronous DRAMs (SDRAMs), or other memory ICs. The memory cell 11 is shown formed in a portion of a semiconductive chip 20, such as a semiconductor wafer. The wafer comprises, for example, silicon. Other semiconductor wafers, including silicon on insulator (SOI) or gallium arsenide, are also useful. The wafer can be undoped or doped lightly or heavily with dopants having a first conductivity. In one embodiment, the chip includes a bulk portion that is advantageously a p-type monocrystalline silicon. Memory cell has the electrical schematic as that shown in FIG. 1. The chip 20, which includes a bulk monocrystalline portion 21, comprises a trench 22. In one embodiment, the trench includes a substantially square cross section filled with, for example, heavily doped n+ type polycrystalline silicon 23 that serves as the storage node 16 (FIG. 1) of memory cell 11. Trenches with other shaped cross section are also useful.

The n+polysilicon fill also corresponds to one plate 14A (FIG. 1) of the capacitor 14 merged with a sourcedrain 12A of the transistor 12.

A dielectric layer 24 surrounds the sidewalls and bottom of the trench 22 and serves as the dielectric of the capacitor 14. Optionally, a heavily doped n+ type layer 26 surrounds the outside of the trench 22 insulated from its fill 23 by the dielectric layer 24. Layer 26 serves as the other plate 14B (FIG. 1) of the capacitor 14. The p-type bulk 21 of the chip 20 typically is maintained at a reference potential, typically ground, as discussed above. Other reference potentials, such as Vpp/2, are also useful.

Located over the trench 22 is a vertical transistor that corresponds to transistor 12. The vertical MOSFET transistor includes n+ type layers 34 and 37, each generally circular in cross section, that correspond to source/drain 12B and source/drain 12A of FIG. 1 and so form the two output current terminals of the transistor. Intermediate between these extend the p-type layer 30 within which there will be created the n-type inversion layer (not shown) to serve as the conductive channel between the layers 34 and 37 when the gate voltage is such as to put the transistor in its closed switch conductive state. The gate dielectric of the transistor is provided by a silicon oxide layer 32 that surrounds layer 30. Layer 34 will merge with a conductive layer 36 that serves as a bit line 52 of the DRAM and runs over the surface of the trench in the direction normal to the plane of the drawing. Layer 37 corresponds to the storage node 16 (FIG. 1) of the memory cell 10.

A word line 50 is provided by the segmented n+ type layer, shown as portions 38A, 38B, that also runs over the top surface of the chip 20 orthogonal to a bit line 35 36, as will appear from the discussion of FIG. 3 below. Layer portions 38A and 38B serve as the gate electrode 12C of transistor 12. The p+ type intermediate region 30 and the gate dielectric layer 32 essentially are stitched in between the two segments 38A and 38B of the word line 50. An oxide layer 40 insulates a bottom surface of the word line 50 from a top surface of the silicon chip 20.

It is desirable that the intermediate region 30 be of high mobility for the charge carriers, such as electrons in the NMOS-type transistor, because of its potential for higher switching speed. For this reason, it is desirable that the intermediate region comprises essentially monocrystalline. In accordance with one embodiment of the invention, a substantially monocrystalline intermediate region 30 is provided between the silicon layer 37 that serves as one source/drain 12A (FIG. 1) of the switching transistor and the silicon layer 34 over the region 30 that serves as the other source/drain 12B (FIG. 1) of the switching transistor. As shown, the intermediate region merges with the bit line 36 of the cell.

Figure 3:
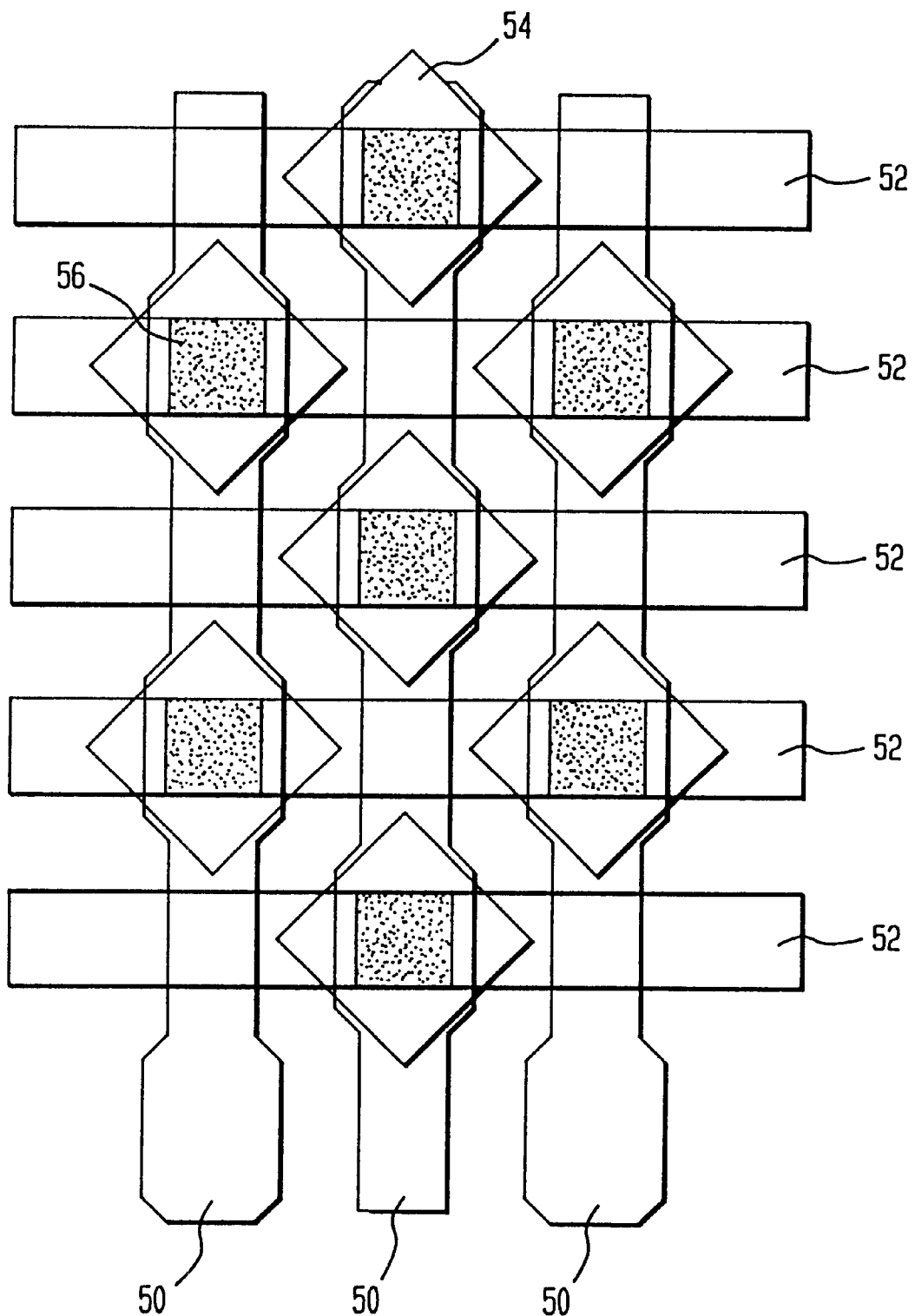
FIG. 3 is a top of a memory array using vertical transistors superposed over vertical trenches, in accordance with the present invention.

In FIG. 3, there is shown a top view of a two dimensional rectangular array of memory cells 11 of FIG. 2. As seen in FIG. 3, the columns of word lines 50 are running vertically, and the rows of bit lines 52 are running horizontally. Insulated crossovers are provided where the two sets of lines would otherwise intersect. The larger tilted squares 54 represent the outline of the vertical trenches 22, and the smaller squares 56 enclosed within the larger tilted square 54 are the outlines of the vertical transistors.

Referring to FIGS. 4–10, the various steps for forming a memory cell in accordance with one embodiment are shown.

Typically a plurality of memory ICs are fabricated in parallel on a wafer. After the parallel processing, the wafer is subsequently diced into a number of chips. Each chip typically houses a single IC, each of which contain many thousands of cells and the associated auxiliary circuitry for writing in, reading out, and refreshing. For the sake of simplicity, the discussion of the processing will be limited to that involved with a single memory cell.

Figure 4:
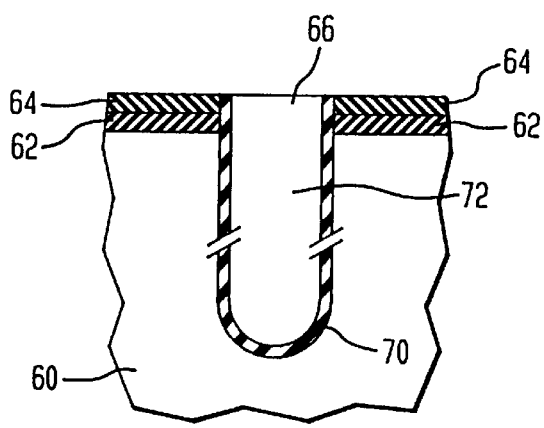
FIGS. 4–10 show a portion of a silicon chip in various stages of the formation therein of a memory cell of the kind shown in FIG. 2 by one process in accordance with the present invention.

As shown, a trench is formed in a slice of a semiconductor substrate or wafer that serves as the workpiece 60. In one embodiment, the wafer comprises a silicon lightly doped with p-type dopants (p−). As is shown in FIG. 4, one typically begins by forming over the surface of a silicon workpiece (chip) 60, a thin layer 62 of silicon oxide, generally referred to as the PAD oxide. This layer primarily serves to protect the surface of the slice 60 during the processing and is removed in the course of the processing. The PAD oxide 62 is generally covered with a layer 64 of silicon nitride, generally described as the PAD nitride, that primarily serves as an etch stop in some of the subsequent processing steps.

Next there is formed in the silicon workpiece 60 a trench 66 that will subsequently be filled with polysilicon. The polysilicon is heavily doped with n-typed dopants (n+) and serves as the storage node of the cell. This can be done in the usual fashion that requires providing a properly patterned mask layer over the surface of the slice and using anisotropic reactive ion etching (RIE) to form a trench in the silicon. The mask, for example, comprises TEOS. Other types of hard mask for etching the trench are also useful. Next, if a heavily doped plate region, as represented by n+ type layer 26 in FIG. 2, is to be included, which is optional, it would be formed by, for example, introducing a suitable dopant in the trench and diffusing it out into the substrate. There are a variety of techniques available to this end, as by coating the interior of the trench with an arsenic-rich coating and heating to diffuse the arsenic into the silicon wall of the trench for doping it n+ type. To simplify the drawing, this layer is being omitted in this and subsequent figures.

After the n+ type plate is formed, the walls of the trench 66 are precleaned prior to the formation a dielectric layer 70. The dielectric layer is formed on the trench walls and over the mask layer. The dielectric layer serves as the dielectric of the capacitor. The dielectric layer comprises, for example, silicon oxide, silicon nitride, silicon nitrideoxide, or silicon oxynitride formed by conventional techniques Next, the trench is filled with n+ type doped polycrystalline silicon 72 (polysilicon). To get a good fill, the polysilicon is built up on a top surface of the workpiece 60 until the trench 66 is filled, as is shown in FIG. 4. After this, the top surface is subjected to chemical mechanical polishing (CMP) to planarize the surface of the workpiece 60. In this operation, the dielectric layer 64 serves as an etch stop to achieve planarization, as shown in FIG. 4.

The dielectric layer 70 on the surface and the hard mask layer (not shown) are then removed, leaving the pad nitride and residual polysilicon. Removal of the dielectric and hard mask layer is achieved by, for example, wet chemical etch such as HF. Other etch processes for removing the layers are also useful. A CMP is employed to planarize the surface, removing the poly to result in a planar top surface.

Figure 5:
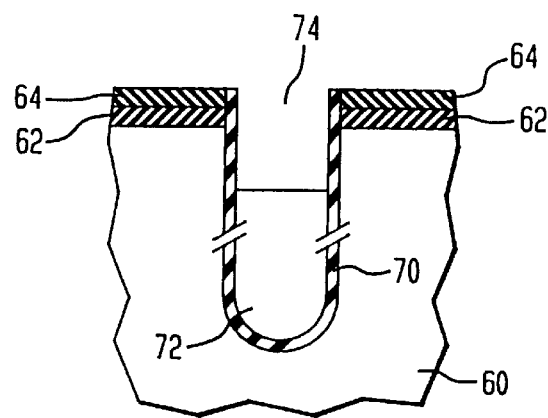

Optionally, the top portion of the trench is recessed by RIE. The RIE is selective to the pad nitride and dielectric layers. The result is shown in FIG. 5. Recess 74 improves the quality of the epitaxially grown silicon over the polysilicon trench. In one embodiment, the recess is sufficiently deep so as to enable the trench to be substantially monocrystalline at about the plane of the top surface of the silicon workpiece. As such, the recess improves the quality of the epitaxially grown silicon above the trench.

Figure 6:
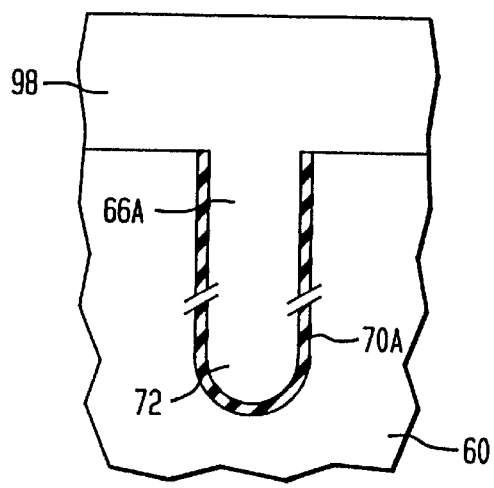

Referring to FIG. 6, the pad nitride and oxide layers are stripped away to bare the monocrystalline silicon surface of the workpiece 60 in preparation for the epitaxial growth of silicon over the trench to form the vertical transistor. The removal of the pad layers is achieved by, for example, wet chemical etch. The bare silicon surface imparts seed information for growing silicon thereon.

A silicon layer 98 is grown epitaxially over the surface of the workpiece 60. In one embodiment, the epitaxial silicon layer is heavily doped with n-type dopants. The n+ silicon layer, for example, is in situ doped during epitaxial growth. Growth of epitaxial silicon is described in, for example, U.S. Ser. Nos. 08/667,541 and 08/605,622 which are herein incorporated by reference for all purposes. The epitaxial layer 98 is grown sufficiently thick and sufficiently crystalline such that recrystallization by heating can make it sufficiently monocrystalline for use as the intermediate layer of the vertical NMOS transistor that is formed thereof, as is shown in FIG. 2.

Figure 7:
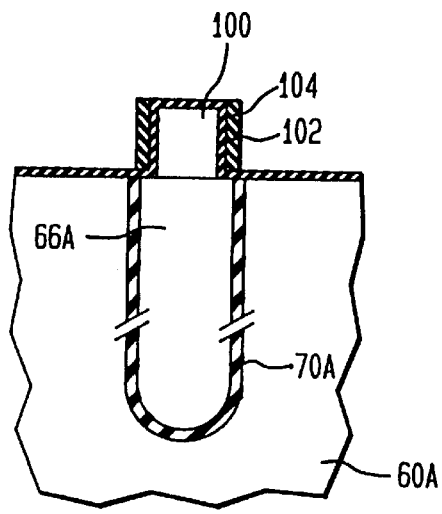

The top surface of the workpiece is now masked so that the epitaxial layer 98 can be removed except where it overlies the polysilicon filled trench. After this removal, there remains a mesa 100, as is shown in FIG. 7, located over the polysilicon filled trench 66A.

Then over the exposed surface of the mesa 100, there is formed an oxide layer 102 that is suitable for use as the gate dielectric of the vertical transistor being formed.

After this oxide layer 102 is formed over the entire exposed surface of the mesa, it becomes necessary to remove the oxide 102 selectively from the top surface of the mesa 100. Typically this is done by first forming a silicon nitride layer 104 over the surface of the mesa 100, removing it selectively from the top surface of the mesa, while leaving only nitride spacers over the side wall of the mesa, and then etching away selectively the exposed oxide on the top surface of the mesa and the exposed oxide overlying the remainder of the workpiece 60A.

Figure 8:
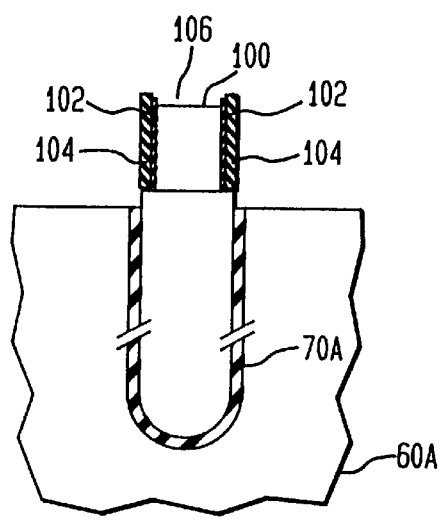

Next it is desirable, although not necessary, to etch the silicon at the top of the mesa to form a shallow recess 106 at the top of the mesa, as is shown in FIG. 8. There may also be removed silicon at the surface of the workpiece 60A not protected by the mesa. This permits the gate oxide to provide source/drain overlap. This overlap is a factor known to be desirable for high speed switching of the transistor.

Figure 9:
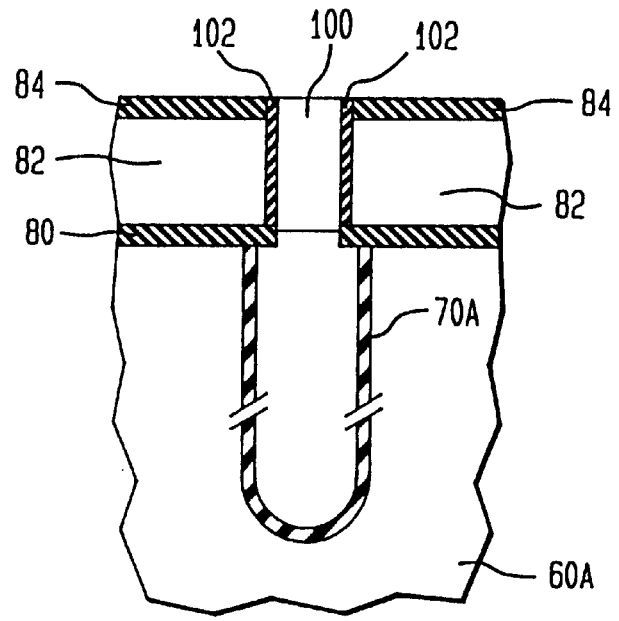
Figure 10:
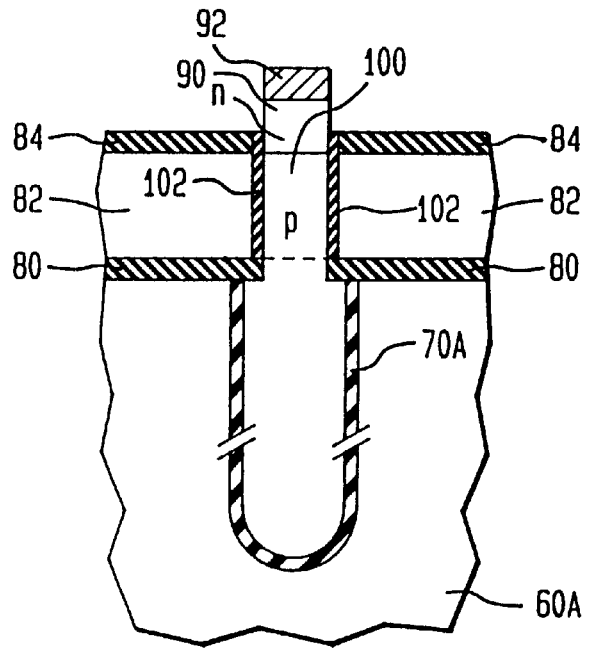

As is shown in FIGS. 9 and 10, essentially there remains only to provide the drain/source region and the word and bit lines. To this end, there is first deposited the first oxide layer 80 that insulates the surface of the workpiece from the word line layer 82 that will subsequently be deposited over it.

Before deposit of the word line layer, there needs to be removed the nitride spacers 104 on the sides of the mesa 100, so that the polysilicon word line can make physical contact to the gate oxide 102. This is advantageously done by a wet etch that attacks only the nitride spacer. After the nitride spacers have been removed, there are deposited in turn the n+ type conductivity polysilicon layer 82 and the second oxide layer 84 to arrive at the structure shown in FIG. 9.

After the deposition of these two layers, CMP is used to remove the excess of such layers and to arrive at the structure shown in FIG. 9, leaving exposed the bared epitaxial silicon at the top surface of the mesa.

Referring to FIG. 10, there is deposited over the exposed surface of the silicon mesa a layer of n+ type conductivity polysilicon 90 to form the drain/source region and a layer of a metallic suicide 92 to form a highly conductive bit line.

There now results a cell that corresponds in essential details to the cell shown in FIG. 2.

It is to be understood that the specific embodiments described are merely illustrative of the general principles of the invention and various modifications will be possible without departing from the spirit and scope of the invention. For example, the monocrystalline silicon in which the memory cell is formed may be a layer of silicon that has been grown epitaxially on a suitable crystal of a foreign material, such as sapphire. Still further, the particular conductivity types can be reversed and the conductivity of the various silicon layers varied as is known to workers in the art. Still further, the various processing steps involved, such as etching and depositions, may be varied. Furthermore, while the invention has been described in terms of silicon as the semiconductor, which presently is the preferred choice other types of substrates are also useful. The scope of the invention should therefore be determined not with reference to the above description but with reference to the appended claims along with their full scope of equivalents.

What is claimed is:

1. In a process for making a memory cell the improvement comprising the steps of:

I) forming a trench in a silicon chip of one conductivity type;

II) forming a dielectric layer over walls of the trench;

III) filling the trench with polysilicon of a conductivity type opposite that of the chip;

IV) growing an epitaxial silicon layer over the surface of the chip of sufficient thickness for forming over the top of the trench a layer of essentially monocrystalline silicon of a conductivity that is opposite that of a chip for serving as a first source/drain;

V) patterning the eptaxial silicon layer to form a mesa over the trench;

VI) forming a first dielectric layer over the surface of the chip, covering the epitaxial silicon mesa;

VII) forming spacers on the side of the mesa, the mesa comprising a material in which the first dielectric layer can be removed selectively to the spacers;

VIII) removing the first dielectric layer from the surface of the chip and top of the epitaxial silicon mesa, wherein the spacers protect the first dielectric layer from being removed from the sides of the mesa;

IX) forming a second dielectric layer over the surface of the chip;

X) removing the sidewall spacers, leaving the first dielectric layer on the side of the mesa, the first dielectric layer on the sides of the mesa serving as gate oxide;

XI) forming a first polysilicon layer of the conductivity type opposite that of the chip over the surface of the second dielectric layer;

XII) forming a third dielectric layer over the surface of said polysilicon layer;

XIII) planarizing the third dielectric layer to expose the surface of the epitaxial silicon mesa; and XIV) forming and patterning a second polysilicon layer of the conductivity opposite that of the chip to form a polysilicon mesa over the epitaxial silicon mesa.

2. The process of claim 1 further comprising:

forming a trench capacitor within a trench disposed within the substrate;

depositing a dielectric layer on the walls of said trench;

filling the trench with a polysilicon fill doped with n+ type dopants; and forming a first portion of a vertical transistor disposed above said trench capacitor, said forming said first portion of said vertical transistor including;

forming a first current output terminal, the first current output terminal being coupled to the trench;

forming a channel disposed above the first current output terminal, forming an annular gate dielectric region surrounding the channel, and forming a wordline above the trench capacitor said wordline being coupled to the annular gate dielectric region and insulated from said trench capacitor by a first insulating layer;

forming a second portion of said vertical transistor, including:

forming a second output current terminal disposed about the channel; and forming a bit line disposed above and coupled to the second output current terminal.

3. A process for fabricating a memory cell as in claim 2, wherein said substrate comprises silicon.

4. A process for fabricating a memory cell as in claim 3, wherein said silicon comprises a p-type monocrystalline silicon.

5. A process for fabricating a memory cell as in claim 2, wherein said substrate comprises gallium arsenide.

6. A process for fabricating a memory cell as in claim 2 wherein said forming said trench capacitor further comprises forming a n+ type conductivity layer within said trench prior to said depositing said dielectric layer, said n+ type conductivity layer forming a fist plate of said trench capacitor, said polysilicon fill forming a second plate of said trench capacitor.

7. A process for fabricating a memory cell as in claim 2, wherein forming said first portion of said vertical transistor comprises growing an epitaxial silicon layer over said semiconductor substrate; and forming a mesa of epitaxial silicon, said mesa having an exposed top surface and side walls of epitaxial silicon; and forming an oxide layer surrounding said sidewalls of said mesa to form said annular gate dielectric region.

8. A process for fabricating a memory cell as in claim 7, wherein said forming said oxide layer comprising:

depositing said oxide layer over said exposed top surface and side walls of said mesa;

depositing a nitride layer over said oxide layer;

forming nitride spacers surrounding said side walls of said mesa by selectively removing a portion of said nitride layer from a top surface of said mesa;

removing a portion of said oxide layer that is not protected by said nitride spacers; and removing said nitride spacers along said side walls of said mesa.

9. A process for fabricating a memory cell as in claim 2, wherein said wordline comprises n+ type conductivity polysilicon.

10. A process for fabricating a memory cell as in claim 2, wherein said bitline comprises metallic silicate.

11. A process for fabricating a memory cell as in claim 2, wherein said annular gate dielectric region overlaps said second current output terminal of said vertical transistor.

12. A process for fabricating a memory cell as in claim 11, wherein said annular gate dielectric region also overlaps said first current output terminal of said vertical transistor.

* * * * *